United States Patent
Yoshida et al.

(10) Patent No.: US 7,611,982 B2
(45) Date of Patent: Nov. 3, 2009

(54) METHOD OF FORMING SHEET HAVING FOREIGN MATERIAL PORTIONS USED FOR FORMING MULTI-LAYER WIRING BOARD AND SHEET HAVING FOREIGN PORTIONS

(75) Inventors: Masayuki Yoshida, Tokyo (JP); Shunji Aoki, Tokyo (JP); Junichi Sutoh, Tokyo (JP); Genichi Watanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 489 days.

(21) Appl. No.: 10/553,517

(22) PCT Filed: Apr. 14, 2004

(86) PCT No.: PCT/JP2004/005308

§ 371 (c)(1),
(2), (4) Date: Oct. 14, 2005

(87) PCT Pub. No.: WO2004/093105

PCT Pub. Date: Oct. 28, 2004

(65) Prior Publication Data

US 2006/0223331 A1 Oct. 5, 2006

(30) Foreign Application Priority Data

Apr. 15, 2003 (JP) .............................. 2003-110399

(51) Int. Cl.
*H01L 21/4763* (2006.01)
(52) U.S. Cl. ........................ 438/618; 438/622; 438/637; 257/E21.575
(58) Field of Classification Search ................. 438/381, 438/618, 622, 619, 637; 257/E21.575
See application file for complete search history.

(56) References Cited

U.S. PATENT DOCUMENTS

| 4,604,160 | A | * | 8/1986 | Murakami et al. | ............ 216/18 |
| 5,309,629 | A | * | 5/1994 | Traskos et al. | ................ 29/830 |
| 6,555,913 | B1 | * | 4/2003 | Sasaki et al. | ................ 257/773 |
| 6,831,357 | B2 | * | 12/2004 | Nishitani et al. | ............ 257/697 |
| 2005/0194084 | A1 | | 9/2005 | Yoshida et al. | |

FOREIGN PATENT DOCUMENTS

| JP | 50-2059 | 1/1975 |
| JP | 51-118390 | 10/1976 |
| JP | 58-93298 | 6/1983 |

(Continued)

*Primary Examiner*—Michael Trinh
(74) *Attorney, Agent, or Firm*—Oblon, Spivak, McClelland, Maier & Neustadt, L.L.P.

(57) ABSTRACT

The present invention relates to a laminated type electronic part and aims at providing a sheet manufacturing method and a sheet that contribute to high integration, downsizing and enhancement of reliability of the electronic part. To accomplish this object, the manufacturing method according to the present invention involves forming a layer composed of a positive resist on a support body, repeatedly executing an exposure process, a developing process and a depositing process of depositing a substance having a desired electrical characteristic into an obtained pattern space with respect to the layer, and thereafter removing the support body. The sheet composed of portions, having three or more types of different physical properties, of which an aspect ratio in pattern is equal to or larger than 1, is provided by this manufacturing method.

3 Claims, 7 Drawing Sheets

FOREIGN PATENT DOCUMENTS

| | | |
|---|---|---|
| JP | 59-32115 | 2/1984 |
| JP | 61-90496 | 5/1986 |
| JP | 61-127196 | 6/1986 |
| JP | 63-43396 | 2/1988 |
| JP | 63-244797 | 10/1988 |
| JP | 3-1830 | 1/1991 |
| JP | 3-7157 | 1/1991 |
| JP | 4-38158 | 6/1992 |
| JP | 5-39119 | 6/1993 |
| JP | 06-059117 | 3/1994 |
| JP | 6-36472 | 5/1994 |
| JP | 06-204665 | 7/1994 |
| JP | 07-211571 | 8/1995 |
| JP | 9-199663 | 7/1997 |
| JP | 10-012455 | 1/1998 |
| JP | 11-186097 | 7/1999 |
| JP | 2000-40633 | 2/2000 |
| JP | 2000-164457 | 6/2000 |
| JP | 2000-182870 | 6/2000 |
| JP | 2000-183530 | 6/2000 |
| JP | 2000-331858 | 11/2000 |
| JP | 2000-331865 | 11/2000 |
| JP | 2001-076959 | 3/2001 |
| JP | 2001-085264 | 3/2001 |
| JP | 2001-110662 | 4/2001 |
| JP | 2001-111223 | 4/2001 |
| JP | 2001-267167 | 9/2001 |

* cited by examiner

METHOD OF FORMING SHEET HAVING FOREIGN MATERIAL PORTIONS USED FOR FORMING MULTI-LAYER WIRING BOARD AND SHEET HAVING FOREIGN PORTIONS

TECHNICAL FIELD

The present invention relates to, as typified by a laminated inductor and a laminated capacitor, a laminated type electronic part exemplified by a so-called multi-layered wiring substrate having built-in passive components etc. The present invention relates more particularly to a so-called ceramic green sheet used when manufacturing the multi-layered wiring substrate and to a method of manufacturing the single ceramic green sheet including portions composed of a variety of materials.

BACKGROUND ARTS

Over the recent years, with higher performance of electronic devices, or with the rapid spread of portable devices, electronic parts are requested to have an improvement of high frequency characteristics together with high-density packaging. What is examined to respond such a request is a manufacturing method capable of attaining a hyperfine element or high-accuracy manufacturing in the process of producing the electronic parts. Documents disclosing these methods are given such as Japanese Patent Application Laid-Open No. 2001-85264, Japanese Patent Application Laid-Open No. 2001-110662, Japanese Patent Application Laid-Open No. 2001-76959, Japanese Patent Application Laid-Open No. 2000-331858, Japanese Patent Application Laid-Open No. 2000-331865, Japanese Patent Application Laid-Open No. 2001-111223, Japanese Patent Application Laid-Open No. 2000-183530, and Japanese Patent Application Laid-Open No. 10-12455.

For instance, the manufacturing method will be briefly described by exemplifying a so-called laminated ceramic inductor as the electronic part. To begin with, a slurry obtained by mixing ceramic powder exhibiting a predetermined electrical characteristic with an organic binder is coated thick over a support body such as a PET film. On the thus-acquired insulator layer, metal paste composed of the metal powder and the organic binder is further printed in a predetermined pattern, thus forming an electrode layer. This electrode layer configures part of the inductor body of the ceramic inductor.

A sheet including the inductor of which part is formed on the thus-acquired insulator and a sheet composed of only the insulator are laminated. On this occasion, respective electrode layers on the individual sheets are electrically connected through conductive portions (posts) provided inside the insulator sheets, thereby forming a laminated body serving as the ceramic inductor body. After forming the laminated body, the laminated ceramic inductor is acquired by further executing processes such as sintering and forming an end face electrode. The method of manufacturing the laminated type electronic part etc. other than the ceramic inductor also basically involves conducting a step pursuant to the aforementioned manufacturing step.

In the aforementioned manufacturing method, however, there occurs a limit to providing the electronic part having the higher performance due to scatters in shape and thickness of each layer, a scatter in shrinkage ratio when sintering, etc. Such being the case, the present applicant proposes the electronic part manufacturing method as disclosed in Japanese Patent Application Laid-Open No. 2001-85264 or Japanese Patent Application Laid-Open No. 2001-110662 given above, thus trying to correspond to the high performance requested of the electronic part.

For example, Japanese Patent Application Laid-Open No. 2001-85264 discloses a method of manufacturing the so-called laminated ceramic capacitor as one of the electronic parts. In this manufacturing method, specifically, to start with, a photosensitive slurry obtained by mixing the organic binder exhibiting photosensitivity and the ceramic powder is coated to a predetermined thickness over the surface of the support body subjected to a conductive process beforehand. It is to be noted that this photosensitive slurry may also be formed by an electro-depositing technology. Subsequently, the photosensitive slurry undergoes an exposure process based on ultraviolet rays via a photomask and a developing process using a developer, whereby a layer constructed of a spatial portion and a ceramic portion is formed on the support body.

Herein, an eutectoid layer composed of Ni powder and an acrylic resin is deposited by the electro-depositing technology on this spatial portion to a thickness that is substantially the same as a thickness of the ceramic portion. The thus-acquired sheet constructed of the ceramic portion and the eutectoid layer portion containing the Ni powder is exfoliated from the support body as an integral body and is subjected to the processes such as laminating, sintering and forming the end face electrode, thereby obtaining the laminated ceramic capacitor. Further, Japanese Patent Laid-Open No. 2001-110662 discloses a method of forming the so-called laminated ceramic inductor, wherein this manufacturing method deals with forming the ceramic portion and the spatial portion on the support body, forming the eutectoid layer containing Ag powder over the spatial portion, and so on.

According to the electronic part manufacturing method disclosed in Japanese Patent Application Laid-Open No. 2001-85264 or Japanese Patent Application Laid-Open No. 2001-110662 given above, there is no difference in layer thickness between the ceramic portion and the eutectoid layer in the sheet itself formed on the support body, i.e., these thicknesses are substantially uniform. Hence, as compared with the conventional method of laminating the simple ceramic pattern and the simple electrode pattern, there is a small change in the electrical characteristic due to the sintering process etc., and it follows that the electronic part exhibiting a desired electrical characteristic is obtained with high reproducibility.

At the present, a frequency of a signal used for the electronic device etc. becomes as high as a GHz band, and, for gaining flexibility to the rise in frequency, much higher performance such as decreasing capacitance of a transmission line and reducing resistance at a joining portion is also desired of the above-described electronic part etc. At the same time, further high integration and further downsizing are desired for being provided to the portable terminals. As for the sheet obtained by the aforementioned manufacturing method, it is considered that, for instance, the flexibility to some extent can be attained by making advance in parallel with thinning the layer and optimizing the material such as the conductive paste.

The sheet acquired by the manufacturing method described above is, however, merely made from the two types of materials, i.e., the ceramic portion and the eutectoid layer portion. Accordingly, a restriction that the single sheet be constructed of the single type of insulator and the single type of conductor, is always imposed in terms of manufacturing the electronic part. As a result, it is considered that there might be incurred situations such as 1) causing a restriction in the circuit design and hindering the high integration from a certain level, 2) extremely increasing the number of layers to be laminated and hindering the downsizing from a certain level in the case of forming the electronic part including, e.g., the inductor, and 3) causing a possibility that the reliability decreases due to an increase in the number of layer-to-layer connecting portions as the number of layers increases.

Moreover, the photosensitive slurry is, as explained earlier, acquired by mixing the organic binder having the photosensitivity with the ceramic powder. The ceramic powder normally has an effect of diffusing the ultraviolet rays when in exposure. Therefore, there occurs a phenomenon such as blurring in pattern edge when exposed. As a consequence, in the prior art, when a ratio of a thickness to a width of the wiring pattern to be formed is set as an aspect ratio (thickness÷width), its upper limit is approximately 0.5 through 0.67.

Japanese Patent Application Laid-Open No. 2001-110662 discloses a method for corresponding to this condition. To be specific, a layer composed of only a negative resist formed on a base (substrate) is subjected to patterning, a ceramic portion is formed in a space formed after the patterning by employing the electro-depositing technology, a resist-layer undergoing the patterning is removed, and a portion exhibiting conductivity is formed by the electro-depositing technology in a spatial portion formed after the removal.

According to this method, none of the blur occurs at the pattern edge described above, and hence the sheet having high pattern accuracy can be formed. The restriction that the single sheet be constructed of the single type of insulator and the single type of conductor is, however, still always imposed on even this method. Accordingly, a probability that the situations given in the items 1) through 3) described above is, it is considered, the same with this method.

DISCLOSURE OF THE INVENTION

It is an object of the present invention, which was devised in view of the conditions described above, to provide a method of manufacturing a sheet capable of contributing to high integration, downsizing, high reliability, etc. with respect to a so-called laminated type electronic part such as a laminated ceramic capacitor and a laminated ceramic inductor.

To accomplish the object, a sheet forming method according to the present invention is a sheet forming method of forming a sheet used as each layer when forming a laminated type electronic part, comprising a step of depositing a photosensitive substance of which an exposed portion is removed by a developer up to a predetermined thickness onto a support body, a step of executing an exposure process for forming a predetermined pattern upon the photosensitive substance, executing a process for development-removing the pattern subjected to the exposure process by use of the developer, executing a process of depositing a substance having a desired electrical characteristic onto the portion with the photosensitive substance removed, and forming the sheet or part of the sheet on the support body, and a step of removing the support body from the sheet.

It should be noted that in the aforementioned method, the step consisting of the exposure process, the developing process and the depositing process is, it is preferable, repeated plural number of times. Moreover, in the above-described method, it is preferable that the step consisting of the exposure process, the developing process and the depositing process includes a process of depositing the photosensitive substance in place of the substance having the desired electrical characteristic.

Further, it is preferable that the method described above further comprises a step of depositing a photosensitive substance, having a desired electrical characteristic, of which an unexposed portion is removed by the developer, and a step consisting of a process of forming a further pattern space by exposing and developing the photosensitive substance having the desired electrical characteristic, and a process of depositing the substance having the desired electrical characteristic or a further photosensitive substance into the pattern space.

To accomplish the above object, a sheet according to the present invention is a sheet used as each layer when forming a laminated type electronic part, comprising a portion having at least three types of different physical properties, wherein when forming the portion, there are executed a depositing process of depositing a photosensitive substance of which an exposed portion is removed by a developer, an exposure process of exposing the photosensitive substance, a developing process of developing the photosensitive substance, and at least one deposition-forming process of the portion into a spatial portion obtained by the developing process, and, when a ratio of a thickness to a width of a thickest portion in the portion is set as an aspect ratio (thickness÷width), a value of the aspect ratio is equal to or larger than 1.

It should be noted that in the aforementioned sheet, portions exhibiting different physical properties are, it is preferable, respectively formed in a direction of a plane on which the sheet extends. Further, it is preferable that in the aforementioned sheet, the portions exhibiting different physical properties are formed in a thicknesswise direction of the sheet.

To accomplish the above object, a sheet according to the present invention is a sheet used as each layer when forming a laminated type electronic part, comprising a conductive internal electrode having a first thickness and formed in a first area, a conductive post having a second thickness and formed in a second area existing over the first area and smaller than the first area, and an insulating substance including the internal electrode and the post, wherein at least the post is formed by a step consisting of a depositing process of depositing a photosensitive substance of which an exposed portion is removed by a developer, an exposure process of exposing the photosensitive substance, a developing process of developing the photosensitive substance, and a depositing process of depositing of a conductive substance into a spatial portion obtained by the developing process, and, when a ratio of a forming thickness to a width of at least one of the internal electrode and the post is set as an aspect ratio (thickness÷width), a value of the aspect ratio is equal to or larger than 1.

BEST MODE FOR CARRYING OUT THE INVENTION

Figure 1:
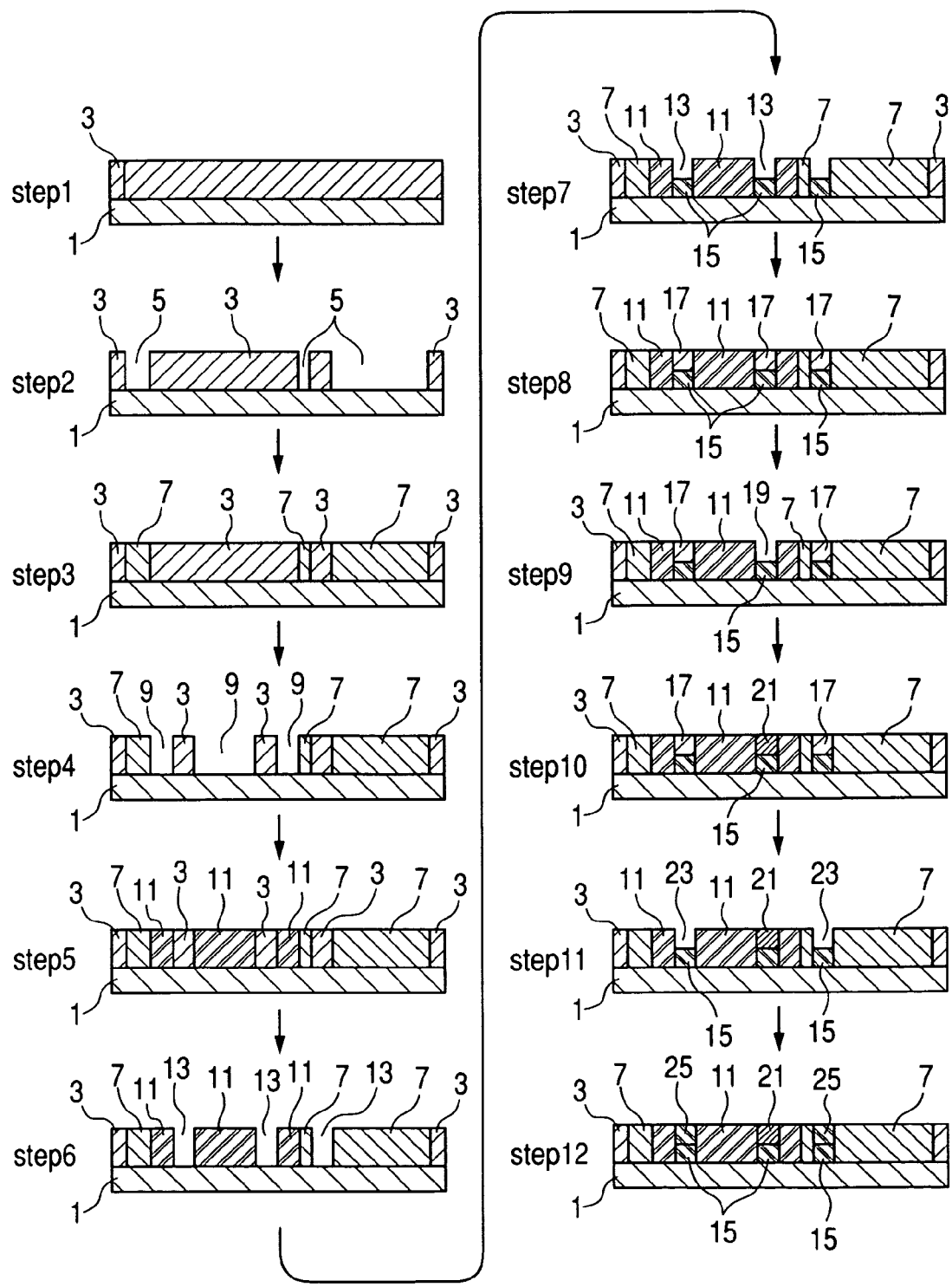
FIG. 1 is a flowchart showing a sheet forming method according to the present invention.

FIG. 1 is a flowchart showing a sheet forming method according to an embodiment of the present invention. Note that FIG. 1 illustrates profiles of the sheet in section in respective steps when cut in a thicknesswise direction thereof. It is assumed that the sheet exemplified has defined portions composed of materials different from each other in an X-Y (plane) direction and a Z (thickness) direction. The sheet forming method will hereinafter be described in depth with reference to the drawings.

To begin with, a layer 3 composed of a positive resist is formed to a predetermined thickness by an electro-depositing process on a surface of a support body 1 subjected to a conductive process, thereby obtaining a sheet in a state in step 1. It should be noted that the positive resist according to the present invention represents a photosensitive substance of which a portion exposed to irradiation of light is removed by a developing process using a developer. Subsequently, there are executed an exposure process of the positive resist layer 3 by ultraviolet rays etc. through an unillustrated first mask and the developing process using the developer. Through the processes described above, only the exposed portion on the positive resist layer 3 is removed, and the unexposed positive resist layer 3 and a first spatial portion 5 are formed on the support body 1 (step 2). An insulator portion is formed by the electro-depositing process in the first spatial portion 5. In the present embodiment, a portion 7 composed of an insulating material, e.g., a lower dielectric constant material is formed (step 3). Note that a forming thickness of the low dielectric constant material portion 7 is approximately coincident with the thickness of the positive resist layer 3.

After forming the low dielectric constant material portion 7, the unexposed positive resist layer 3 is subjected to the exposure process through an unillustrated second mask and the developing process using the developer. With these processes, the exposed portion on the positive resist layer 3 is removed, and further a second spatial portion 9 is formed (step 4). A new insulator portion is formed in the second spatial portion 9 by the electro-depositing process. In the present embodiment, as an insulator, for instance, a portion 11 made from a high permeability material is formed (step 5). Note that in the present embodiment, a forming thickness of the high permeability material portion 11 is also approximately coincident with the thickness of the positive resist layer 3.

Subsequently, the residual unexposed positive resist layer 3 is subjected to the exposure process through an unillustrated third mask and the developing process using the developer. With these processes, the exposed portion on the positive resist layer 3 is removed, and further a third spatial portion 13 is formed (step 6). A portion 15 composed of a first conductive material is formed by the electro-depositing process in the third spatial portion 13. Note that in the present embodiment, when forming the first conductive material portion 15, its forming thickness is set smaller than the thickness of the positive resist layer 3, and the third spatial portion 13 is rendered residual on an upper portion of the first conductive material portion 15 (step 7).

A second layer 17 composed of a positive resist is again formed on the residual portion of the third spatial portion 13 by the electro-depositing process (step 8). On this occasion, the second positive resist layer 17 be, it is desirable, formed till its uppermost surface becomes substantially flush with the surfaces of the positive resist layer 3, the low dielectric constant material portion 7, etc. The second positive resist layer 17 is subjected to the exposure process through an unillustrated fourth mask and the developing process using the developer. With these processes, the exposed portion on the second positive resist layer 17 is removed, and a fourth spatial portion 19 is formed (step 9).

A further insulator portion is formed in the fourth spatial portion 19 by the electro-depositing process. In the present embodiment, as this insulator, a portion 21 composed of, e.g., a low permeability material is formed (step 10). Note that in the present embodiment, the low permeability material portion 21 is formed till its uppermost surface becomes substantially flush with the surfaces of the positive resist layer 3, the low dielectric constant material portion 7, etc. Thereafter, the residual second positive resist layer 17 is subjected to the exposure process and the developing process using the developer. With these processes, the residual second positive resist layer 17 is removed, and a fifth spatial portion 23 is formed (step 11).

A portion 25 composed of a second conductive material is formed in the fifth spatial portion 23 by the electro-depositing process. Note that in the present embodiment, the second conductive material portion 25 is formed till its uppermost surface becomes substantially flush with the surfaces of the positive resist layer 3, the low dielectric constant material portion 7 and so on. Further, in the present embodiment, the material composing the first conductive material portion 15 is the same as the material composing the second conductive material portion 25. The support body 1 is exfoliated from the sheet obtained through the processes described above, thereby acquiring a sheet serving as a material when actually producing an electronic part.

MODIFIED EXAMPLE

Figure 2:
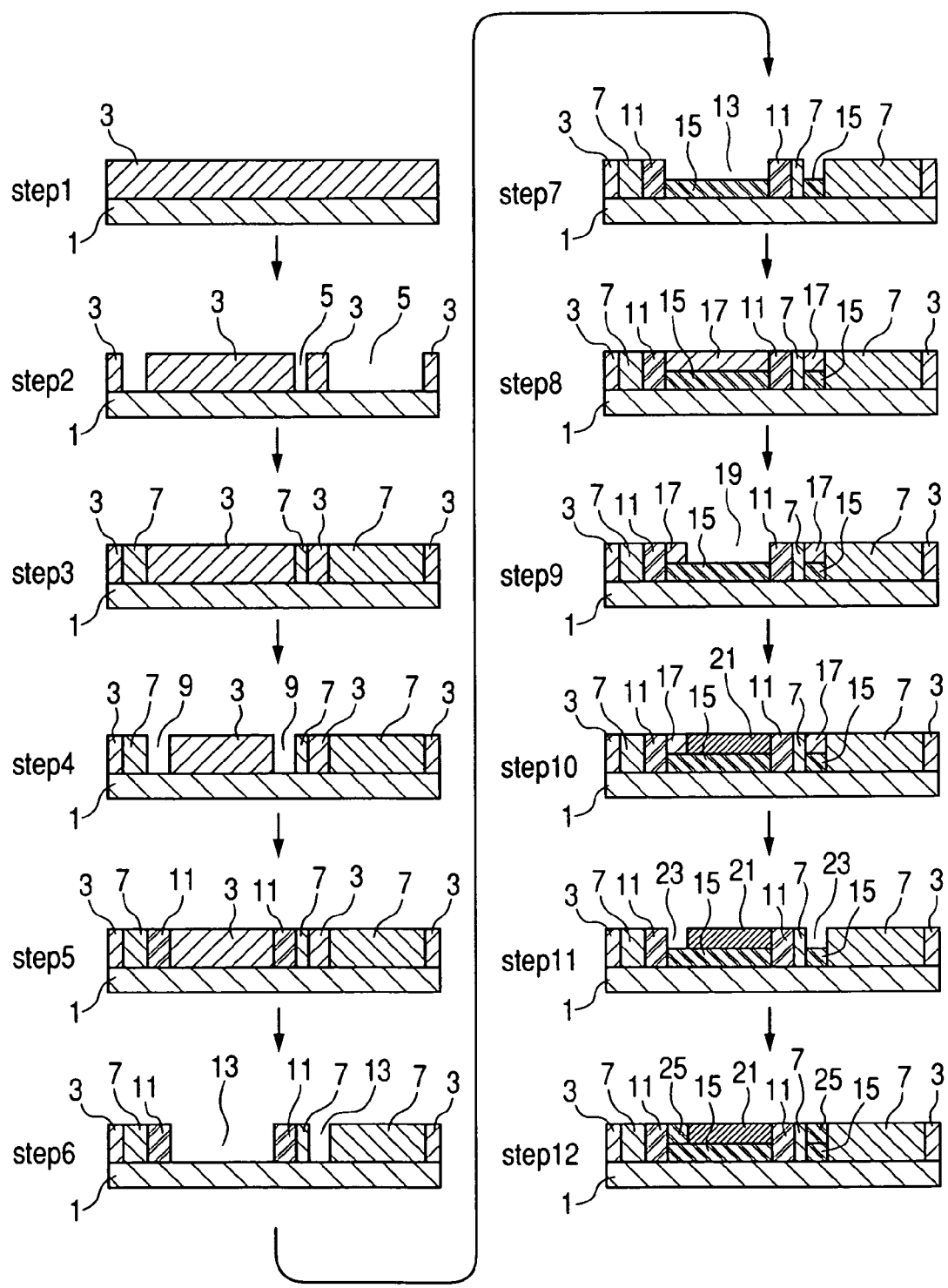
FIG. 2 is a flowchart showing the sheet forming method according to the present invention.

Given subsequently is an explanation of a case in which the sheet forming method according to the present invention is applied to a sheet that internally has a circuit pattern (simply so-called pattern) and a layer-to-layer connecting material (so-called post). FIG. 2 shows the sheet forming method by way of a flowchart. It is to be noted that the views indicated by the respective steps in FIG. 2 show the sections (profiles) of the sheet in the individual steps as in the case of FIG. 1.

To start with, the layer 3 composed of the positive resist is formed by the electro-depositing process on the surface of the support body 1 subjected to the conductive process, thereby obtaining the sheet in a state of step 1. Subsequently, the exposure process and the developing process using the developer are executed on the positive resist layer 3 by the ultraviolet rays etc. through the unillustrated first mask. With these processes, only the portion exposed on the positive resist layer 3 is removed, and the unexposed positive resist layer 3 and the first spatial portion 5 are formed on the support body 1 (step 2). The insulator portion is formed by the electro-depositing process in the first spatial portion 5. In the present embodiment, the portion 7 composed of the insulating material, e.g., the lower dielectric constant material is formed (step 3). Note that the forming thickness of the low dielectric constant material portion 7 is approximately coincident with the thickness of the positive resist layer 3.

After forming the low dielectric constant material portion 7, the unexposed positive resist layer 3 is subjected to the exposure process through the unillustrated second mask and the developing process using the developer. With these processes, the exposed portion on the positive resist layer 3 is removed, and further the second spatial portion 9 is formed (step 4). The new insulator portion is formed in the second spatial portion 9 by the electro-depositing process. In the present embodiment, as the insulator, for instance, the portion 11 made from the high permeability material is formed (step 5). Note that in the present embodiment, the forming thickness of the high permeability material portion 11 is also approximately coincident with the thickness of the positive resist layer 3.

Subsequently, the residual unexposed positive resist layer 3 is subjected to the exposure process through the unillustrated third mask and the developing process using the developer. With these processes, the exposed portion on the positive resist layer 3 is removed, and further the third spatial portion 13 is formed (step 6). The portion 15 composed of the first conductive material is formed by the electro-depositing process in the third spatial portion 13. The first conductive material portion 15 has a function as the pattern in the sheet. Note that in the present embodiment, when forming the first conductive material portion 15, its forming thickness is set smaller than the thickness of the positive resist layer 3, and the third spatial portion 13 is rendered residual on the upper portion of the first conductive material portion 15 (step 7).

The second layer 17 composed of the positive resist is again formed on the residual portion of the third spatial portion 13 by the electro-depositing process (step 8). On this occasion, the second positive resist layer 17 be, it is desirable, formed till its uppermost surface becomes substantially flush with the surfaces of the positive resist layer 3, the low dielectric constant material portion 7, etc. The second positive resist layer 17 is subjected to the exposure process through the unillustrated fourth mask and the developing process using the developer. With these processes, the exposed portion on the second positive resist layer 17 is removed, and the fourth spatial portion 19 is formed (step 9).

The further insulator portion is formed in the fourth spatial portion 19 by the electro-depositing process. In the present embodiment, as the insulator, the portion 21 composed of, e.g., the low permeability material is formed (step 10). Note that in the present embodiment, the low permeability material portion 21 is formed till its uppermost surface becomes substantially flush with the surfaces of the positive resist layer 3, the low dielectric constant material portion 7, etc. Thereafter, the residual second positive resist layer 17 is subjected to the exposure process and the developing process using the developer. With these processes, the residual second positive resist layer 17 is removed, and the fifth spatial portion 23 is formed (step 11).

The portion 25 composed of the second conductive material is formed in the fifth spatial portion 23 by the electro-depositing process (step 12). The second conductive material portion 25 has a function as the post in the sheet. Note that in the present embodiment, the second conductive material portion 25 is formed till its uppermost surface becomes substantially flush with the surfaces of the positive resist layer 3, the low dielectric constant material portion 7 and so on. Further, in the present embodiment, the material composing the first conductive material portion 15 is the same as the material composing the second conductive material portion 25. The support body 1 is exfoliated from the sheet obtained through the processes described above, thereby acquiring the sheet having the pattern and the post inside.

As discussed above, the embodiment of the present invention enables the formation of the sheet having the defined portions composed of plural types of materials such as the low dielectric constant material, the low permeability material, the high permeability material and the conductive material which are equal to or more than three types in this case) in the X-Y (plane) direction and in the z (thickness) direction or the formation of the sheet having the pattern and the post inside. Further, in the present invention, the layer composed of the single positive resist containing none of elements that cause scattering of light etc. is subjected to the exposure process and the developing process, and the portions composed of the respective materials are formed by use of the pattern acquired as a result of these processes.

Accordingly, it is possible to acquire the sheet exhibiting a preferable defined state, wherein pattern accuracy is high, and none of blur etc. exists at a pattern edge. Further, the layer composed of the single positive resist is employed, and hence the layer thickness enabling the exposure by the exposure process is attributed to only a characteristic of the positive resist.

Specifically, by use of the methods described above, though impossible in the prior arts, there are three or more types of portions composed of different substances, and, in the case of taking, as an aspect ratio (thickness÷width), a ratio of a thickness and a width of the portion that is thickest among the respective portions, it is possible to provide the sheet in which the aspect ratio value is equal to or larger than 1. Moreover, in the case of the sheet including the pattern and the post, it is feasible to form the sheet including the post in which the ratio of the forming thickness to the width thereof is equal to or larger than 1.

Note that in the present embodiment, the materials composing the respective portions, i.e., the substances exhibiting the desired electrical characteristics, involve using the low dielectric constant material, the low permeability material, the high permeability material and the conductive material, however, the present invention is not limited to these materials, and it is desirable that the materials properly be changed corresponding to the configuration of the sheet to be acquired. Namely, the portions exhibiting plural types, at least, three types of physical properties different from each other can be formed in the plane direction or in the thicknesswise direction. Accordingly, it is preferable that the number of repetitions of the respective processes such as exposing, developing and electro-depositing be decreased or increased corresponding to the sheet configuration in the present embodiment.

Moreover, the aforementioned positive resist or a resist (photosensitive substance) exhibiting a positive or negative characteristic that contains powder (fine particles) having a desired electrical characteristic, may be electro-deposited when executing the electro-depositing process. In this case, it follows that these resists further undergo the processes such as exposing and developing in the next step. It should be noted that the negative resist stated herein represents a photosensitive substance, wherein a portion other than the portion exposed to the irradiation of the light is developed by the developer.

To be specific, for example, a negative material obtained by mixing insulating powder having the low permeability as a characteristic and the negative resist, may be formed by electro-depositing in the third spatial portion 13 in step 7 in FIG. 1. The low permeability material portion 21 and the fifth spatial portion 23 (refer to step 11) can be formed at one time by effecting the exposure and the development upon the negative material. As explained earlier, the negative resist containing the powder is regarded relatively inferior to the positive resist with respect to the pattern accuracy etc. In consideration of an allowable value etc. of the pattern accuracy, however, the steps can be reduced in the manufacturing method according to the present invention by partially employing the material composed of the negative resist.

Further, the forming thickness of each portion based on the electro-depositing process may not be specified by the thickness of the positive resist layer 3 as in the present embodiment but can be properly set corresponding to the configuration etc. of the sheet to be acquired. For instance, when through a laminating/contact bonding step, the forming state of each portion may be altered such as taking a configuration that an added conductive material portion is swollen from an upper surface of a ceramic portion 3 in order to make preferable the connecting state of the conductive material portion between the sheets to be laminated.

Further, the first and second conductive material portions are made from the same material and may also be composed of different materials. Still further, these conductive material portions may be formed by a method different from the present embodiment such as a plating method etc. without using the electro-depositing process. Yet further, when forming the conductive material portion, the respective processes such as the electro-depositing process, the exposing process and the developing process of the positive resist and the electro-depositing process of the conductive material are further repeated, and a further configuration may also be added in the z (thickness) direction.

Figure 3:
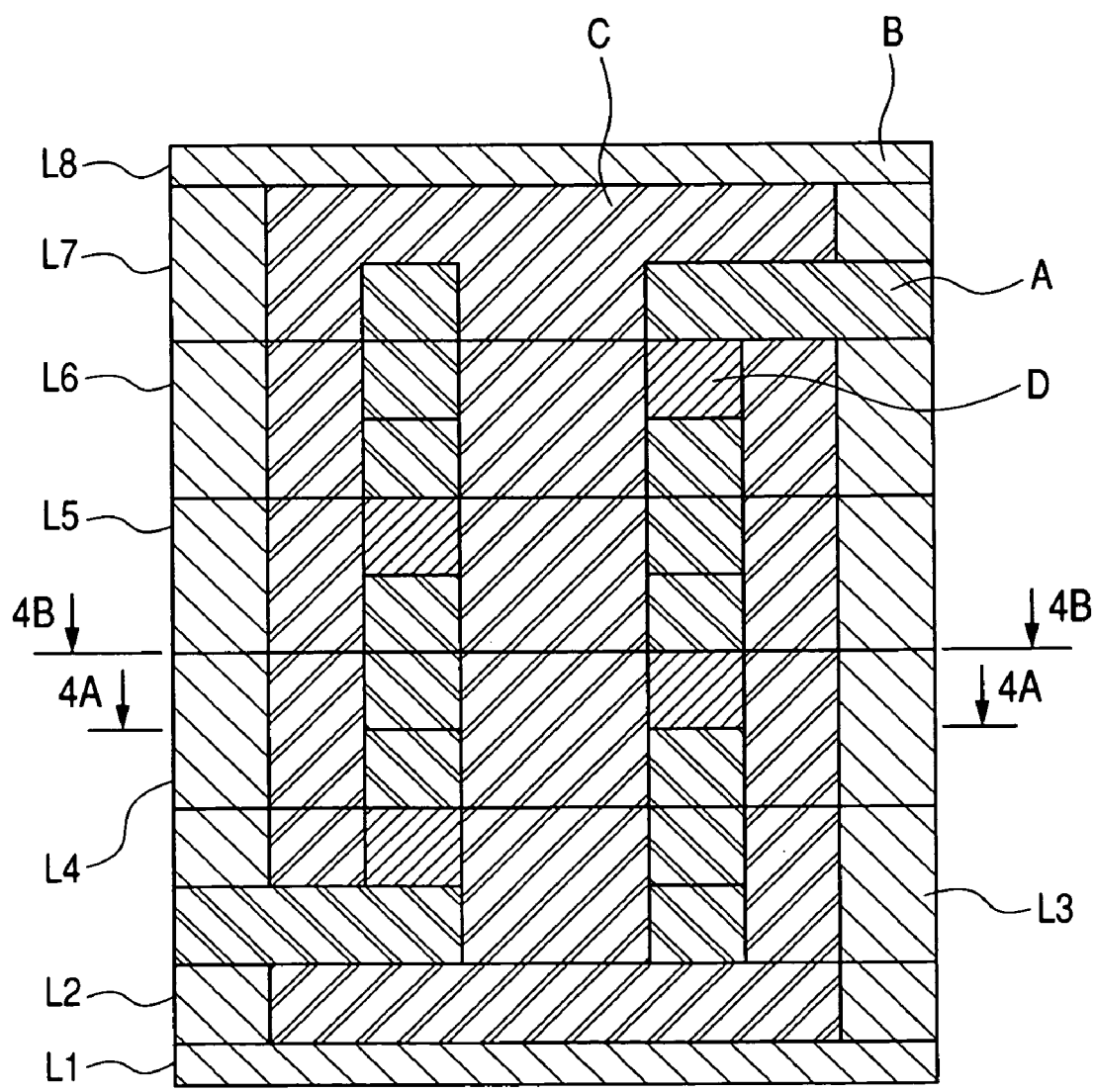
FIG. 3 is a view schematically showing a section of a laminated type inductor manufactured by use of the sheet obtained by the present invention.

Specific Example of Electronic Part Manufactured by Use of Sheet Acquired according to the Invention FIG. 3 shows one example of a ceramic inductor formed by laminating plural types of sheets obtained by properly adding changes to the method according the invention discussed above. FIG. 3 schematically shows a configuration in section when cutting the ceramic inductor in a laminating direction. The inductor is constructed by laminating sheets L1-L8. Each sheet arbitrarily includes conductive material portions A (A1, A2), a first insulator portion B composed of the low dielectric constant material, second insulator portions C (C1, C2) composed of the high permeability material and a third insulator portion D composed of a material exhibiting a lower permeability than the second insulator portion C. Each sheet configuration will hereinafter be briefly explained by exemplifying the sheet L4.

Figure 4A:
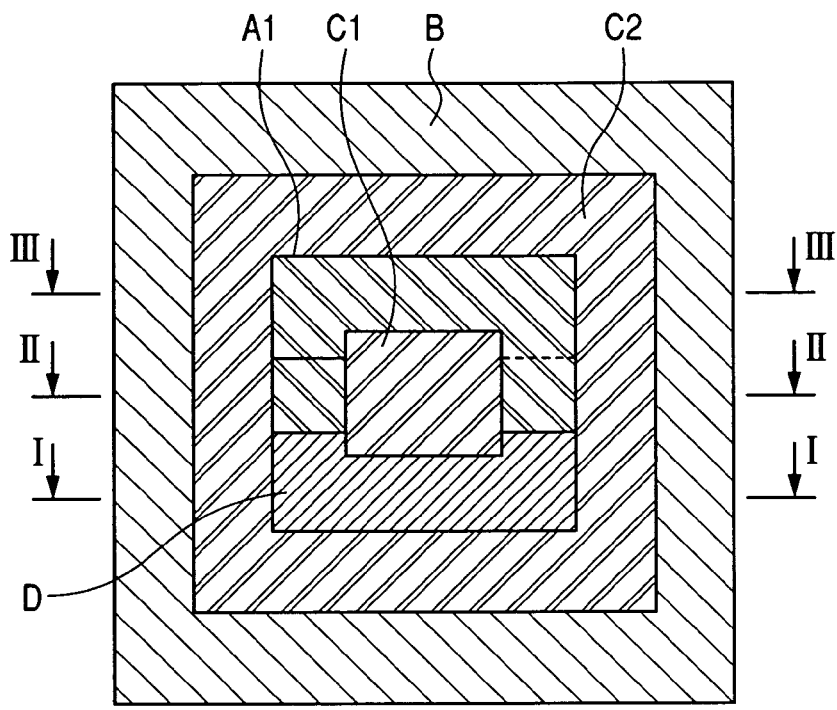
FIG. 4A is a view of the inductor shown in FIG. 3 that is cut along the line 4A-4A and showing an outline of a state as viewed from an upper surface.
Figure 4B:
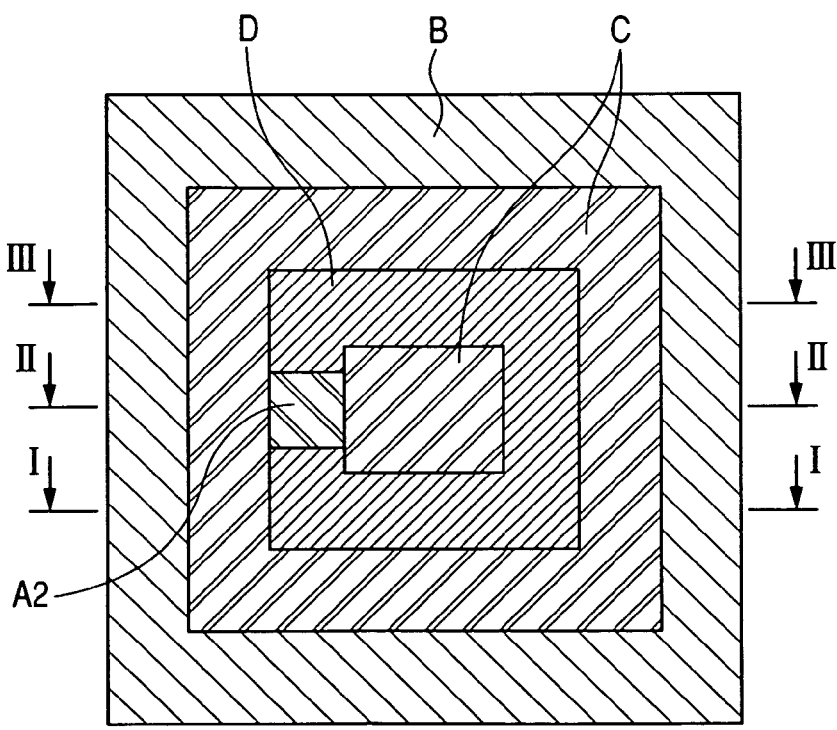
FIG. 4B is a view of the inductor shown in FIG. 3 that is cut along the line 4B-4B and showing an outline of a state as viewed from an upper surface.

In FIG. 3, the sheet L4 is cut by a plane 4A-4A. FIG. 4A shows a view of the sheet L4 as viewed in an arrowhead direction in FIG. 4A. FIG. 4B shows a view of the sheet L4, cut by a plane 4B-4B, as viewed in the arrowhead direction in the FIG. 4B. As illustrated in FIG. 4A, in a lower part of the sheet, the central high permeability material portion C1 functions as a core material in the inductor. The conductor material portion A1 is formed so as to circumscribe approximately a half of the periphery of the high permeability material portion C1, and configures part of the inductor circuit.

The low permeability material portion D is formed along the remaining periphery of the high permeability material portion C1. The insulator portion D functions as an insulating portion for insulating between the conductive material portions A1 superposed on each other in an up-and-down direction when laminating the sheets. The high permeability material portion C2 is disposed along the periphery of the conductive material portion A1 and of the low permeability material portion D, and functions as an insulator portion having an effect in increasing an amount of magnetic flux together with the high permeability material portion C1. Further along the periphery of the high permeability material portion C2, the first insulator portion B composed of the low dielectric constant material shapes a protection layer.

As shown in FIG. 4B, in an upper part of the sheet L4, the insulator portion consisting of the low permeability material portion D is formed so as to circumscribe substantially the entire periphery of the high permeability material portion C1 serving as the core material. This low permeability material portion D functions as an insulating portion for insulating between the conductive material portions A1 superposed on each other in the up-and-down direction when laminating the sheets. Further, the conductive material portion A2 is formed along only part of the periphery of the core material. The conductive material portion A2, which is the connecting conductive material portion for connecting respective parts of the circuit in the inductor formed on the individual sheet, functions as a so-called post.

As described above, the sheet L4 internally has the core material, part of the circuit in the inductor formed around approximately the half of the periphery of the core material, the post for connecting the part of this circuit to part of a circuit on another sheet, the insulator performing a role of insulation between the individual circuit portions on the respective sheets, the insulator disposed along the periphery of the inductor that increases the amount of magnetic flux together with the core material, and the protective material portion disposed along the periphery thereof. A plurality of sheets each having the above configuration are manufactured and laminated so that terminal portions of the circuit portions on the individual sheets are consecutively connected to the terminal portions of the posts, thereby forming the inductor body illustrated in FIG. 3.

Specific Example of Sheet Forming Method for Manufacturing Electronic Part

Figure 5A:
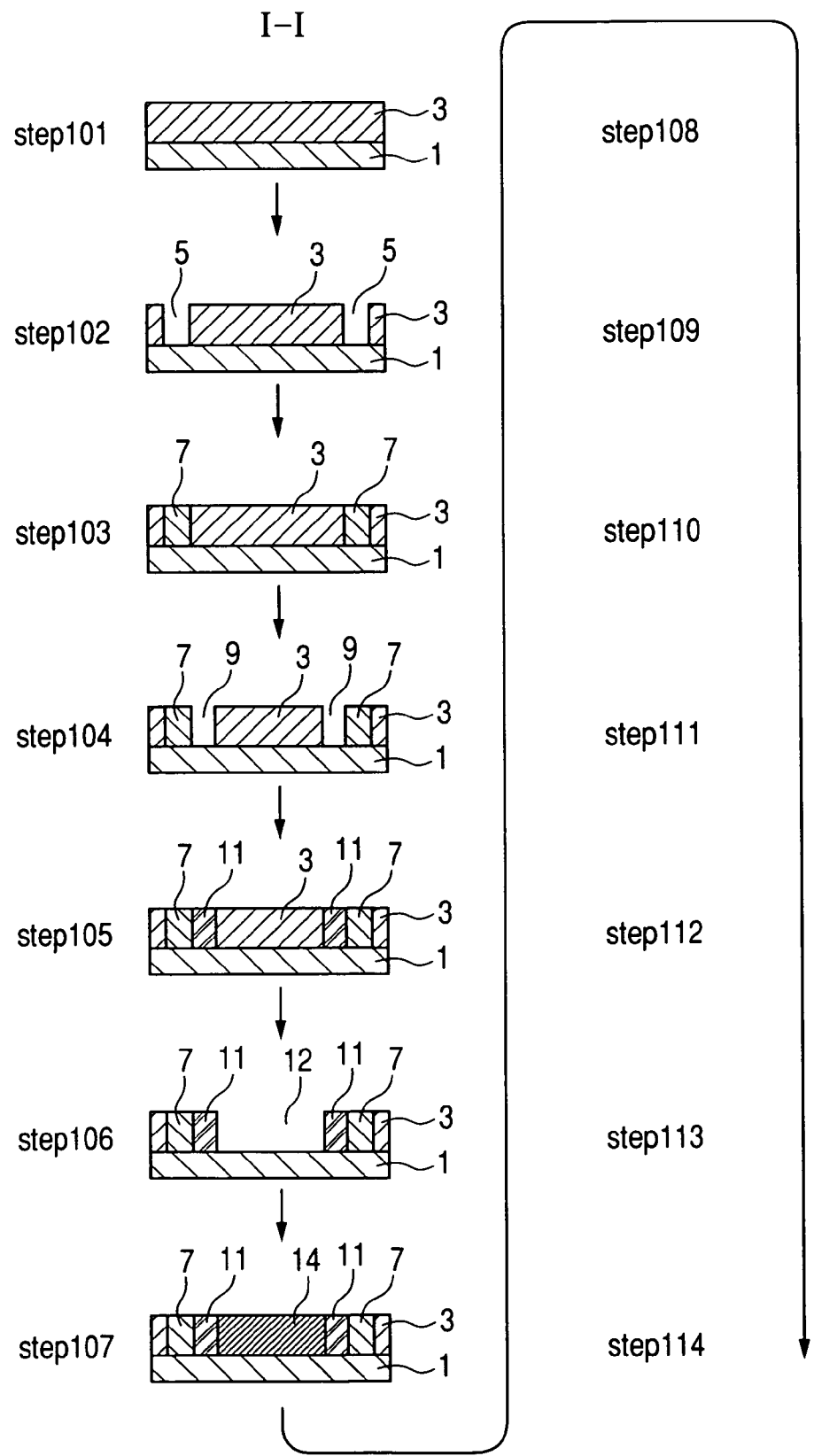
FIG. 5A is a flowchart showing steps of forming a sheet L4 shown in FIG. 3.
Figure 5B:
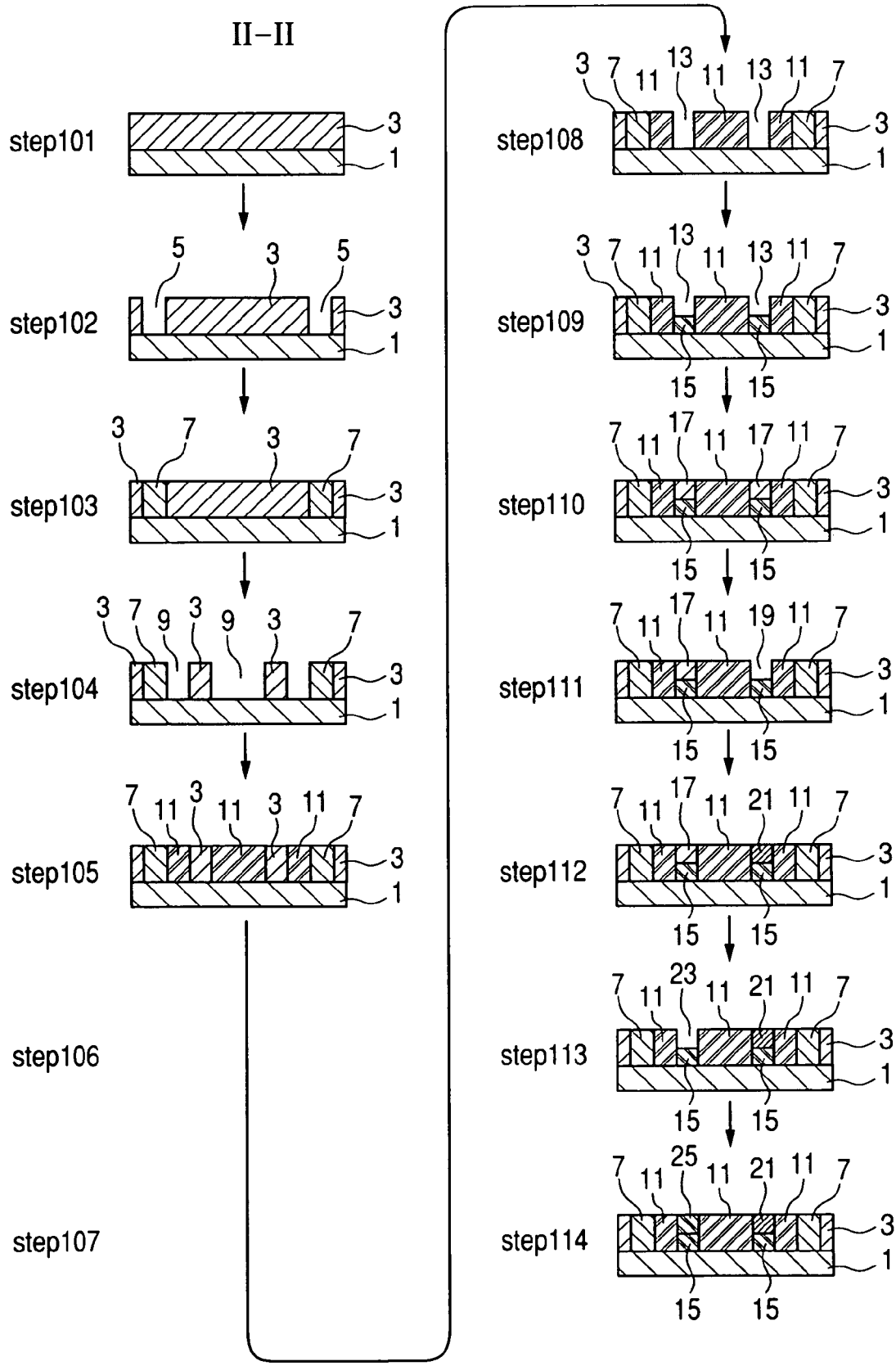
FIG. 5B is a flowchart showing steps of forming the sheet L4 shown in FIG. 3.
Figure 5C:
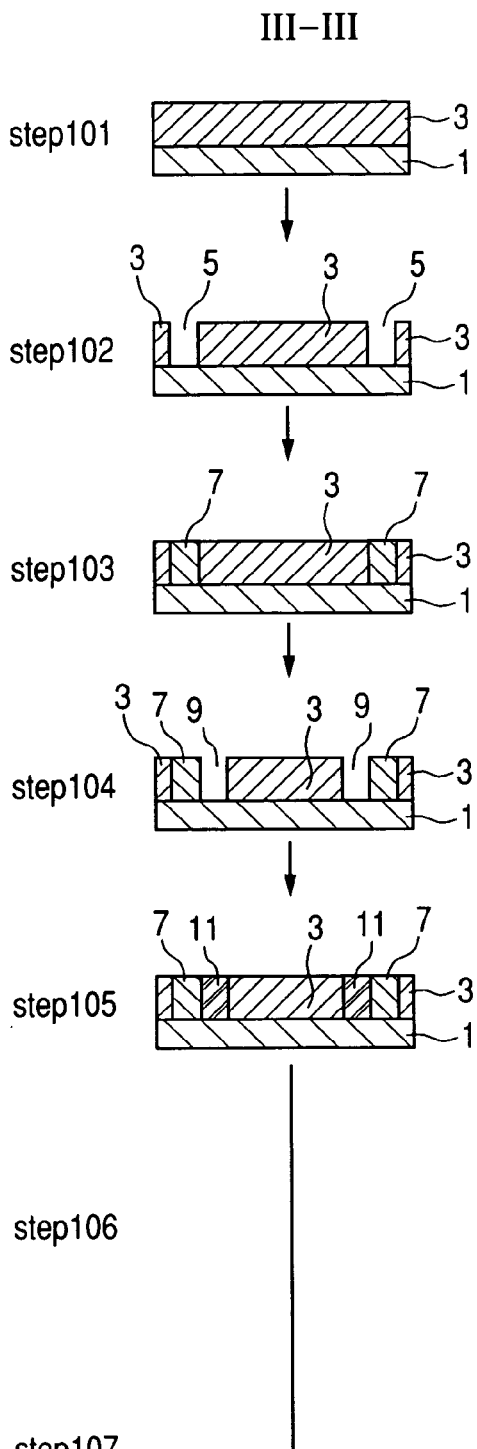
FIG. 5C is a flowchart showing steps of forming the sheet L4 shown in FIG. 3.
Figure 5C:
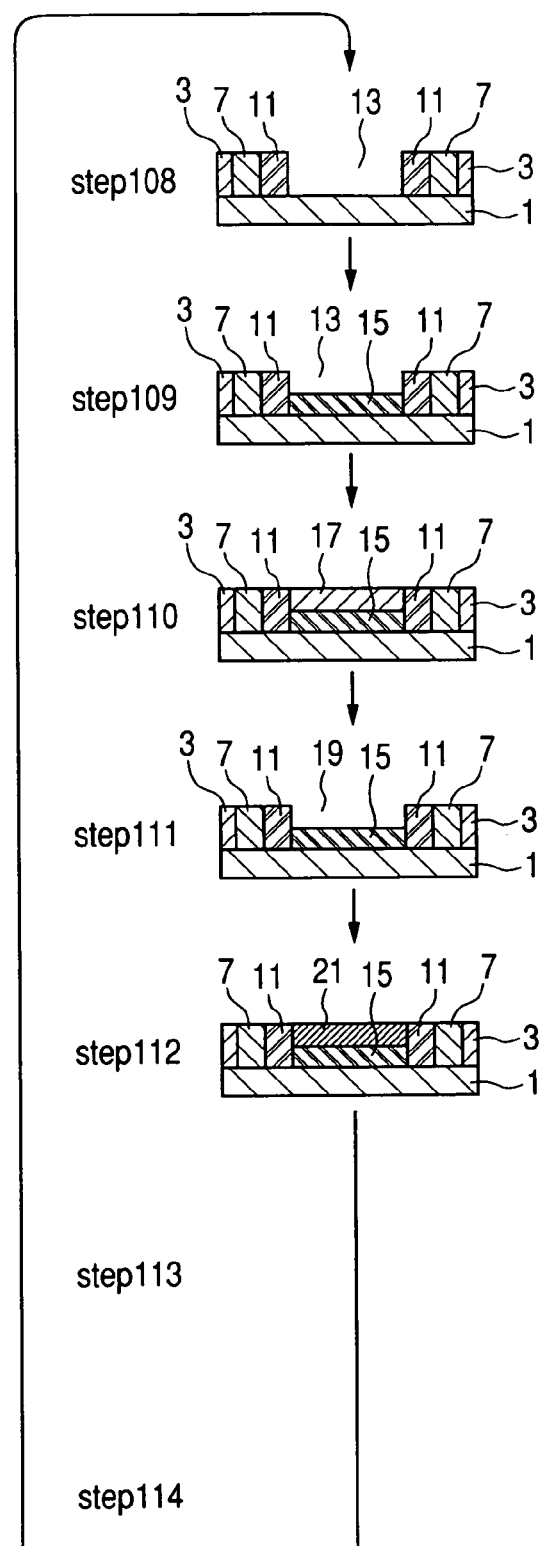

Next, the steps of actually forming the sheet L4 shown in FIGS. 4A and 4B by utilizing the present invention will be described with reference to flowcharts shown in FIGS. 5A-5C. Note that the respective views shown in the flowcharts illustrate, as the FIG. 1 or FIG. 2 show, the sections of the sheet in the individual steps. To be specific, FIG. 5A shows the section when the sheet L4 is cut along the line I-I in FIGS. 4A and 4B, FIG. 5B illustrates the section taken along the line II-II, and FIG. 5C illustrates the section taken along the line III-III, wherein changes in configuration are shown, respectively. The same components as those in the aforementioned embodiment shown in FIG. 1 or FIG. 2 shall be marked with the same reference numerals and symbols.

At first, the layer 3 composed of the positive resist is formed by the electro-depositing on the surface of the support body 1 undergoing the conductive process, thereby obtaining the sheet in a state in step 101. Executed subsequently are the exposure process of the positive resist layer 3 by the ultraviolet rays etc. through the unillustrated first mask and the developing process using the developer. The first mask takes a shape suited to effecting the exposure over an area corresponding to the low dielectric constant material portion B in FIGS. 4A and 4B.

Through these processes, only the exposed portion on the positive resist layer 3 is removed, and the unexposed positive resist layer 3 and the first spatial portion 5 are formed on the support body 1 (step 102). The portion 7 composed of the low dielectric constant material is formed by the electro-depositing process in the first spatial portion 5 (step 103). Note that the forming thickness of the low dielectric constant material portion 7 is approximately coincident with the thickness of the positive resist layer 3. The low dielectric constant material portion 7 corresponds to the low electric constant material portion B in the sheet L4.

After forming the low dielectric constant material portion 7, the unexposed positive resist layer 3 is subjected to the exposure process through the unillustrated second mask and the developing process using the developer. The second mask takes a shape suited to effecting the exposure over an area corresponding to the high permeability material portions C1 and C2 in FIGS. 4A and 4B. With these processes, the exposed portion on the positive resist layer 3 is removed, and further the second spatial portion 9 is formed (step 104).

The portion 11 composed of the high permeability material is formed by the electro-depositing process in the second spatial portion 9 (step 105). Note that the forming thickness of the high permeability material portion 11 is also approximately coincident with the thickness of the positive resist layer 3. The high permeability material portion 11 at the central portion in the section II-II corresponds to the portion C1 serving as the core material on the sheet L4, and other parts of the high permeability material portion 11 correspond to the portion C2 along the outer periphery of the inductor etc. on the sheet L4.

Subsequently, the residual unexposed positive resist layer 3 is further subjected to the exposure process through an unillustrated second mask and the developing process using the developer. The second mask takes a shape suited to effect the exposure over the area corresponding to the low permeability material portion D in FIG. 4A. Through these processes, the exposed portion on the positive resist layer 3 is removed, and further a second' spatial portion 12 is formed (step 106). The low permeability material portion 14 is formed by the electro-depositing process in the second' spatial portion 12 (step 107). Note that the forming thickness of the low permeability material portion 14 is likewise approximately coincident with the thickness of the positive resist layer 3. The low permeability material portion 14 corresponds, on the sheet L4, to the low permeability material portion D in FIG. 4A and the low permeability material portion D in FIG. 4B that is positioned on the upper surface thereof.

Moreover, the residual unexposed positive resist layer 3 is subjected to the exposure process through an unillustrated third mask and the developing process using the developer. The third mask has a shape suited to conducting the exposure over an area corresponding to the conductive material portion A1 in FIG. 4A. Through these processes, the exposed portion on the positive resist layer 3 is removed, and further a third spatial portion 13 is formed (step 108).

A portion 15 composed of the first conductive material is formed by the electro-depositing process in the third spatial portion 13. Note that in the present embodiment, when forming the first conductive material portion 15, the forming thickness thereof is set thinner than the thickness of the positive resist layer 3, and the third spatial portion 13 is rendered residual on an upper part of the first conductive material portion 15 (step 109). The first conductive material portion corresponds to the conductive material portion A1 on the sheet L4.

The second layer 17 composed of the positive resist is again formed by the electro-depositing process on the residual portion of the third spatial portion 13 (step 110). On this occasion, it is desirable that the second positive resist layer 17 be formed till its uppermost surface is substantially flush with the surfaces of the positive resist layer 3, the low dielectric constant material portion 7, etc. The second positive resist layer 17 undergoes the exposure process through an unillustrated mask and the developing process using the developer. The fourth mask has a shape suited to conducting the exposure over an area corresponding to the low permeability material portion D in FIG. 4B. Through these processes, the exposed portion on the second positive resist layer 17 is removed, and a fourth spatial portion 19 is formed (step 111).

A portion 21 composed of the low permeability material is formed by the electro-depositing process in the fourth spatial portion 19 (step 112). Note that in the present embodiment, the low permeability material portion 21 is formed till its uppermost surface is substantially flush with the surfaces of the positive resist layer 3, the low dielectric constant material portion 7, etc. The low permeability material portion 21 corresponds, on the sheet L4, to the low permeability material portion D in FIG. 4B. Thereafter, the residual second positive resist layer 17 is subjected to the exposure process and the developing process using the developer. Through these processes, the residual second positive resist layer 17 is removed, and a fifth spatial portion 23 is formed (step 113).

A portion 25 composed of the second conductive material is formed by the electro-depositing process in the fifth spatial portion 23. Note that in the present embodiment, the second conductive material portion 25 is formed till its uppermost surface is substantially flush with the surfaces of the positive resist layer 3, the low dielectric constant material portion 7, etc. Further, in the present embodiment, the material composing the first conductive material portion 15 is the same as the material composing the second conductive material portion 25. The support body 1 is exfoliated from and the residual positive resist layer 3 is removed from the sheet obtained through the steps described above, thereby acquiring the sheet L4 serving as the material when actually forming the electronic part. With the aforementioned configuration acquired, it is possible to provide the inductor exhibiting much more excellent characteristics than the laminated ceramic inductors in the prior arts have.

According to the present invention, the variety of different materials (portions) can be formed within the same sheet. Hence, the inductor as shown in FIG. 3 can be constructed, and it is feasible to manufacture the laminated type electronic part that attains further downsizing and higher integration by decreasing a stray capacitance, a cross-talk and so on. Moreover, though not explicitly illustrated, a wiring layout etc. for connecting a terminal portion of the inductor body to the external terminal can be arbitrarily arranged round when forming the inductor by use of the sheet according to the present invention.

Accordingly, optimization of the layout of these wiring portions can be facilitated. Namely, the use of the sheet having the configuration according to the present invention acquires effects such as a) an effect enabling the higher integration by improving a degree of freedom of the circuit design, b) an effect enabling downsizing of the electronic part by, preferably, decreasing the number of laminated layers even when manufacturing the electronic part having the equal characteristics on the occasion of forming composite circuit parts, and c) an effect that the wiring connections between the layers are decreased as a concomitant of the reduction in the number of layers, the reliability is improved, and further a decrease in the number of steps till the electronic part is completed can be estimated.

Note that the sheet forming method according to the present invention has been discussed so far in depth, however, the variety of materials such as the support body described herein are not particularly limited. The support body can involve using a variety of materials such as a thin plate of a stainless group, a PET film with its surface subjected to the conductive process, and a glass substrate with its surface subjected to the conductive process. Moreover, there is a case of executing a release process on the surface of the support body, however, the release process is exemplified by forming the surface of mixture composite layers of Ni-PTFE, stainless powder and a Teflon resin or a silicon resin, and so forth.

Further, Ag, Cu, Ni, etc. are usable as metal powders used in the electro-depositing process for forming the conductive material portion. Though not particularly specified as to the positive resist, it is desirable that the material be properly selected from a variety of materials, including the selection of the materials such as the conductive material and the insulator, while taking its viscosity, photosensitivity, etc. into consideration. Further, in the sheet forming method described above, the formation of the conductive material portion is the formation by the electro-deposition. If there is no necessity of forming a further material, however, this conductive material portion shall be formed by plating as one of the electro-depositing technologies and may also be composed of only substantially a metal.

Moreover, each portion and the positive resist on the sheet according to the present invention are subjected to their forming steps by employing the electro-depositing technology. The present invention is not, however, limited to the electro-depositing technology, and can use a variety of methods employed for forming a normal layer such as coating the paste. As described above, however, with respect to forming the conductive material portion, it is considered that there is a case where the plating technology etc. is preferable in terms of further enhancing the conductivity, and it is considered desirable to build up the manufacturing steps so that the conductive material portion can be formed by plating etc.

Moreover, the sheet forming method according to the present invention acquires the variety of effects given above by using the positive resist, however, the content of the present invention is not limited to the embodiment discussed above. For example, when forming the element, the positive resist and the negative resist may be used in combination in a way that partially applies the pattern formation using the same negative resist as in the prior arts for the portion which the pattern accuracy etc. is not much requested of.

By the sheet forming method according to the present invention, i.e., the method of repeatedly executing the exposure process, the developing process and the process of forming by the electro-deposition the desired material in the pattern space obtained by the developing process upon the positive resist layer, it is possible to obtain the sheet in which there are inwardly disposed the portions composed of three or more types of different materials with the high accuracy in the X-Y direction and the portions composed of plural types of different materials with the high accuracy in the Z direction. Further, the pattern space is formed by executing the exposure process and the developing process on the layer composed of the single positive resist, thereby obtaining the pattern, wherein the ratio of the thickness to the width of the pattern, which is the so-called aspect ratio, is equal to or larger than 1, 1 through 1.5, which is approximately 1.5 through 3 times as large as the value in the prior art.

Moreover, according to the present invention, the variety of patterns can be formed with the high accuracy and with the high positional precision, and hence there are acquired effects such as a) an effect of improving the degree of freedom of the circuit design and enabling the higher integration, b) an effect enabling a reduction in the total number of the laminated layers owing to the high integration of the circuit for the single layer of sheet, and enabling the downsizing of the electronic part, c) an effect of reducing the connecting portions between the respective layers as a contaminant of the phenomenon pertaining the to the number of the laminated layers, and enabling the improvement of the reliability or the reduction in the steps, d) an effect enabling the variety of materials to be formed in the proper positions and enabling the improvement of performance of the laminated type electronic part, and e) an effect enabling the improvement of the cost performance in the electronic part manufacturing step owing to a stack of these effects.

Still further, the sheet having the high dimensional accuracy is obtained, and hence there are acquired effects such as f) an effect of improving the positional precision between the layer-to-later connecting members on each sheet, and improving the connection reliability, g) an effect enabling the smaller-and-smaller shape optimization of the layer-to-layer connecting member, and enabling the higher integration, and h) an effect capable of making the layer-to-layer connecting member exist within the sheet having the thickness, improving the degree of freedom as compared with the conventional design etc. taking account of strength of the portion related to the layer-to-layer connecting member, and further improving the lamination accuracy owing to handling stability.

Further, the layer is formed only on the necessary portion by the electro-depositing process etc., and therefore the manufacturing cost can be reduced without any futility of the materials. Yet further, after forming the variety of sheets, the electronic part is acquired by laminating these sheets, and hence the types of the sheets to be laminated or the laminating form etc. can be changed corresponding to the characteristics requested of the electronic part. Therefore, the electronic part manufacturing step flexible to more-type less-quantity productions can be easily built up by use of the sheet according to the present invention.

It should be noted that the prior art for executing the patterning and the electro-depositing process by employing the slurry composed of the powder exhibiting the desired electrical characteristic and the organic binder, the slurry being composed of the so-called negative resist, is greatly inferior to the present invention in terms of the pattern accuracy obtained. It is, however, feasible to partially acquire the effects given above by employing partially the steps using the positive resist according to the present invention, corresponding to the accuracy requested of the product, e.g., an allowable value of scatter in the electrical characteristic.

What is claimed is:

1. A sheet forming method of forming a sheet used as each layer when forming a laminated electronic part, comprising:
  a step of depositing a photosensitive substance of which an exposed portion is removed by a developer up to a predetermined thickness onto a support body;
  a step of executing an exposure process for forming a predetermined pattern upon the photosensitive substance, executing a process for development-removing the pattern subjected to the exposure process by use of the developer, executing an electro-depositing process using a substance having an electrical characteristic onto the portion with the photosensitive substance removed, and forming said sheet or part of said sheet on said support body; and
  a step of removing said support body from said sheet,
  wherein said step consisting of the exposure process, the developing process and the electro-depositing process is repeated a plural number of times.

2. A sheet forming method, of forming a sheet used as each layer when forming a laminated electronic part, comprising:

a step of depositing a photosensitive substance of which an exposed portion is removed by a developer up to a predetermined thickness onto a support body;

a step of executing an exposure process for forming a predetermined pattern upon the photosensitive substance, executing a process for development-removing the pattern subjected to the exposure process by use of the developer, executing a process of depositing a substance having an electrical characteristic onto the portion with the photosensitive substance removed, and forming said sheet or part of said sheet on said support body; and a step of removing said support body from said sheet, wherein said step consisting of the exposure process, the developing process and the depositing process includes a process of making residual a part of the portion with the photosensitive substance removed in a way that stops the depositing process halfway, and depositing the photosensitive substance in place of the substance having the electrical characteristic on the residual part.

3. A sheet forming method of forming a sheet used as each layer when forming a laminated electronic part, comprising:

a step of depositing a photosensitive substance of which an exposed portion is removed by a developer up to a predetermined thickness onto a support body;

a step of executing an exposure process for forming a predetermined pattern upon the photosensitive substance, executing a process for development-removing the pattern subjected to the exposure process by use of the developer to form a first pattern space, executing a process of depositing a first substance having a first electrical characteristic onto the first pattern space so that a part of the first pattern space is rendered residual as a residual portion, depositing a second substance which has a second electronic characteristic and of which an unexposed portion is removed by the developer, onto the residual portion, forming a second pattern space by exposing and developing the second substance, depositing first, second, or other substance into the second pattern space, and thus forming said sheet or part of said sheet on said support body; and a step of removing said support body from said sheet.

* * * * *